United States Patent [19]
Rosenthal

[11] Patent Number: 5,341,047
[45] Date of Patent: Aug. 23, 1994

[54] LEVEL SHIFTER CIRCUIT

[75] Inventor: Bruce D. Rosenthal, Los Gatos, Calif.

[73] Assignee: Elantec, Inc., Milpitas, Calif.

[21] Appl. No.: 991,094

[22] Filed: Dec. 16, 1992

[51] Int. Cl.[5] .................. H03K 19/0175; H03K 19/003
[52] U.S. Cl. .................................. 307/475; 307/443; 307/296.8
[58] Field of Search ............ 307/475, 451, 443, 296.8, 307/594

[56] References Cited
U.S. PATENT DOCUMENTS

| | | | |
|---|---|---|---|
| 4,242,604 | 12/1980 | Smith | 307/475 |
| 4,340,867 | 7/1982 | Sano | 307/443 |
| 4,473,762 | 9/1984 | Iwahashi et al. | 307/594 |
| 5,235,219 | 8/1993 | Cooperman et al. | 307/296.8 |

FOREIGN PATENT DOCUMENTS 2113934  8/1983  United Kingdom ................ 307/451

*Primary Examiner*—Edward P. Westin
*Assistant Examiner*—Jon Santamauro
*Attorney, Agent, or Firm*—Leo V. Novakoski; Albert C. Smith

[57] ABSTRACT

An improved voltage level shifting circuit is provided that employs a reference voltage translation circuit having its input at a fixed reference voltage, to bias the operating point of a substantially similar signal voltage circuit. The reference circuit generates a bias current in response to the reference voltage which is coupled back to buffers in the reference and signal translation circuits. The bias current maintains the operating point of the signal translation circuit close to the switching point determined by the reference voltage.

9 Claims, 3 Drawing Sheets

LEVEL SHIFTER CIRCUIT

BACKGROUND OF THE INVENTION

Field of the Invention

The present invention relates to the field of voltage level shifting circuits, and in particular to voltage level shifting circuits for buffering signals from a circuit based on one family of digital logic to a circuit based on a second family of digital logic.

Description of Related Art

Various applications require the translation of voltages from one level to another. A prime example is the translation of digital signals between circuits based on different families of digital logic. For example, a single application may require communication between different logic family circuits for reasons of speed, power dissipation, or availability. Each family of logic devices has supply voltage requirements, current requirements, and switching voltages (threshold voltages) determined by the properties of the underlying semiconductor materials. Thus, a dependable level shifting circuit must transmit logical high and low signals between circuits having different supply and switching voltages while preserving the logical state of the signal.

The preservation of logical states during the shifting process requires the establishment of a stable switching point to distinguish high and low logical states. Conventional voltage shifter circuits often rely on the supply voltage to establish the switching point of the circuit. In addition, these circuits often employ hysterisis to sharpen the transitions between high and low logic levels. However, each of these circuit configurations imposes limitations on the operation of voltage translation circuits.

The reliance on supply voltages to establish the circuit switching point can compromise the stability of the switching point, since variations in circuit processing or temperature may change the supply voltage. In addition, the use of hysterisis to insure sharp transitions between high and low logic levels can slow the response of the voltage shifting circuit considerably, since the signal driving the circuit input must overcome the hysterisis before the output of the shifter changes state. Accordingly, there is a need for a voltage shifting circuit which combines fast response time with dependable switching characteristics.

SUMMARY OF THE INVENTION

In accordance with the present invention, an improved level shifter circuit is provided that has fast response times, relatively low power consumption, signal buffering, and a switching voltage that is substantially independent of circuit temperature and processing variations.

The level shifter of the present invention utilizes a reference voltage translation circuit having its input at a fixed reference voltage to bias the operating point of a substantially similar signal voltage circuit. The reference circuit generates a bias current in response to the reference voltage which is coupled back to buffers in the reference and signal translation circuits. In this way, the operating point of the signal buffer is maintained close to the switching point determined by the reference voltage.

Thus, the voltage shifter of the present invention utilizes a reference voltage translation circuit in conjunction with current feedback to establish a stable switching point without sacrificing the response time of the circuit.

DETAILED DESCRIPTION OF THE INVENTION

Figure 1:
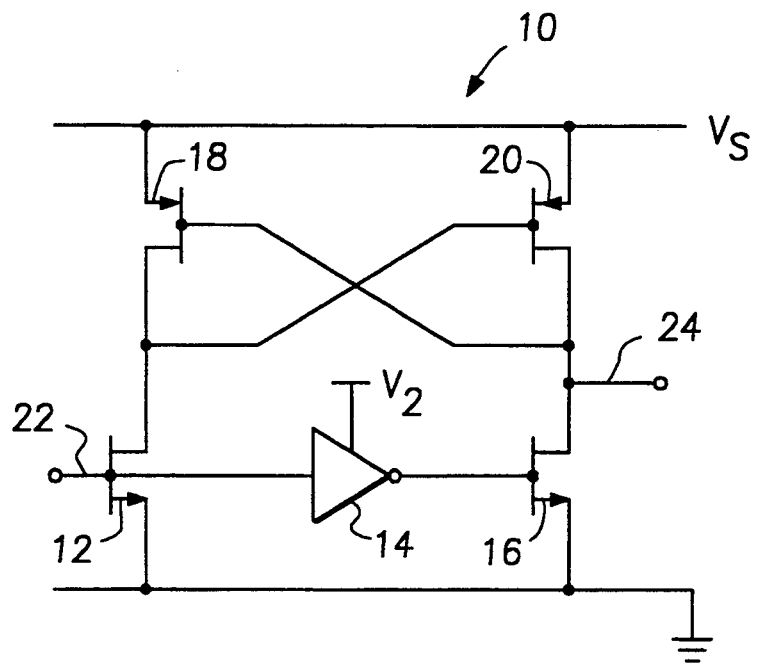
FIG. 1 is a schematic diagram of a prior art voltage shifting circuit.

Referring to FIG. 1, there is shown a conventional level shifting circuit 10 in which a digital logic signal is applied to the gate of a transistor 12 and to the input of an inverting buffer 14. The output is taken from the drain of transistor 16. Transistors 18, 20 provide hysterisis to voltage shifter 10, insuring that output 24 makes a sharp transition between high and low states in response to a corresponding change in the logic state at the circuit input 22.

One drawback of voltage shifting circuit 10 is that switching is slow since the signal at input 22 must overcome the hysterisis created by transistors 18, 20 before output 24 can change. In addition, the voltage at which shifter circuit 10 switches is sensitive to the supply voltage, $V_S$, and a second voltage, $V_2$, must be provided to drive buffer 14. A current source at the drain of transistor 12 may be used to reduce the sensitivity of the switching point to $V_S$. However, voltage shifting circuit 10 still has a slow response time. In addition, for high frequency inputs, transistor 12 has a high input capacitance due to the Miller effect.

Figure 2:
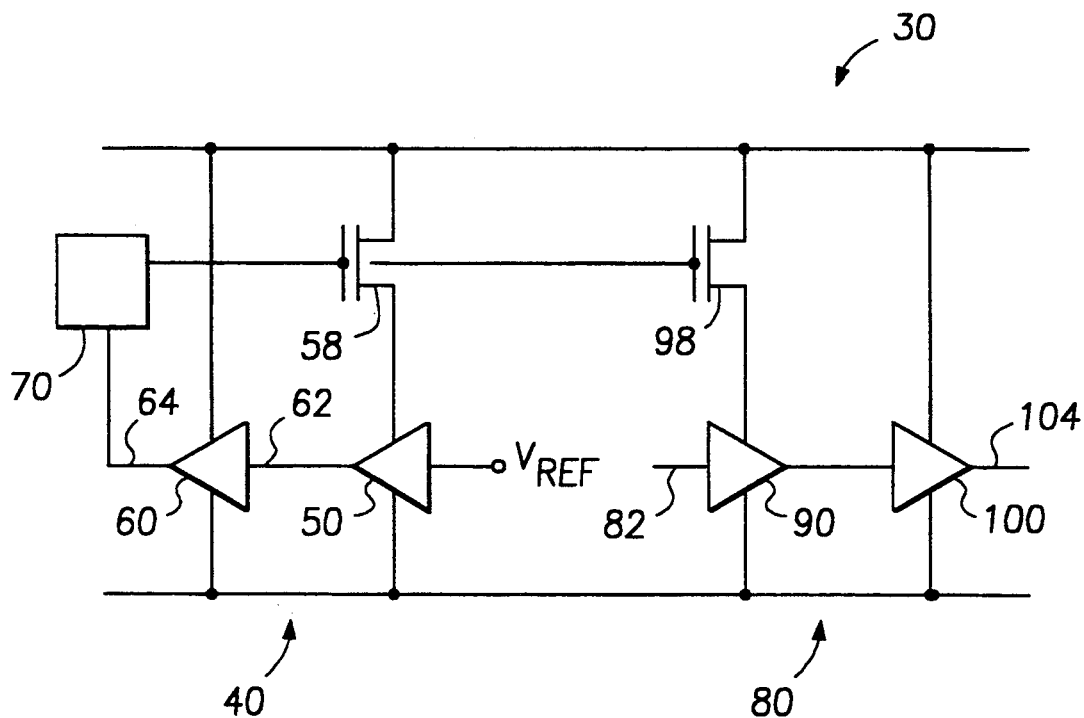
FIG. 2 is a block diagram of a voltage shifting circuit in accordance with the present invention.

Referring now to FIG. 2, there is shown a block diagram of a voltage shifting circuit 30 in accordance with the present invention. A reference voltage translation circuit 40 includes a current sensitive buffer 50, a gate circuit 60, and a transistor 58. Buffer 50 is driven by a reference voltage, $V_{REF}$, and provides a signal at input 62 of gate circuit 60 which is determined by $V_{REF}$ and the current controlled by transistor 58. Gate circuit 60 produces a signal at an output 64 between ground and the supply voltage that is determined by the signal at a input 62. A feedback circuit 70 detects the signal generated at output 64 by $V_{REF}$ and couples a corresponding current controlling signal back to transistor 58.

A signal voltage translation circuit 80 is substantially similar to reference voltage translation circuit 40, including a buffer 90, a gate circuit 100, and a transistor 98 which receives a feedback signal from feedback circuit 70. Accordingly, the current to signal buffer 90 is adjusted by means of feedback circuit 70 and transistor 98 to equal the current through buffer 50, which is generated in response to the reference voltage.

Figure 3:
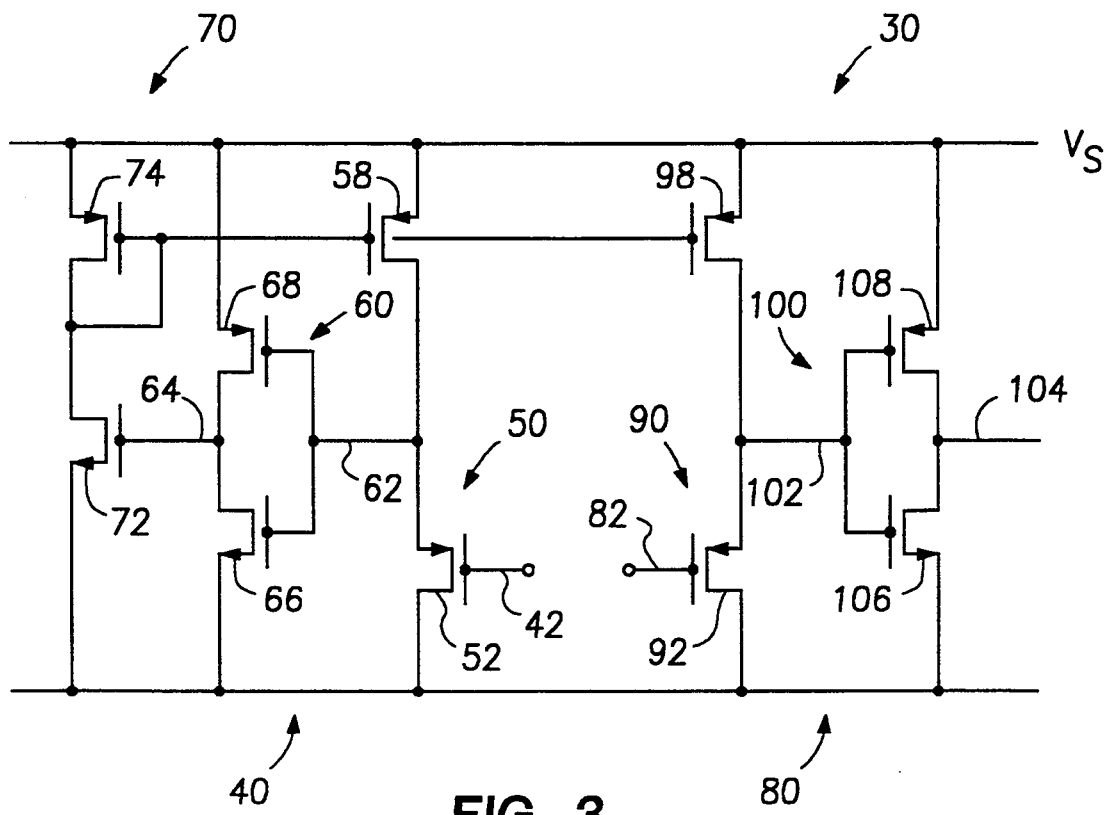
FIG. 3 is a schematic diagram of a voltage shifting circuit in accordance with the present invention, including gates and buffers.

Referring now to FIG. 3, there is shown a schematic diagram of one embodiment of the present invention. The reference voltage translation circuit 40 has a source follower transistor 52 acting as current sensitive buffer 50. The gate of source follower transistor 52 forms an input 42 of reference voltage translation circuit 40, its drain is connected to a reference potential such as ground, and its source is connected to the drain of transistor 58.

AS before, transistor 58 has its source connected to $V_S$ and its gate connected to the output of feedback circuit 70. Current to source follower transistor 52 is controlled by the signal applied to the gate of transistor 58 by current feedback circuit 70.

Gate circuit 60 includes a pair of complimentary transistors 66, 68 connected in series. Transistor 66 has its source connected to ground and its drain connected to the drain of transistor 68, while transistor 68 has its source connected to $V_S$. The gates of transistors 66 and 68 are connected together to form input 62 of gate circuit 60 and the drains of complimentary transistors 66, 68 form output 64 of gate circuit 60.

A signal voltage translation circuit 80 is substantially similar to reference voltage translation circuit 40. Thus, a source follower transistor 92 has its source connected to a transistor 98, its drain connected to a reference potential, and its gate forming an input 82 of signal voltage translation circuit 80. Transistor 98 controls the current flowing in source follower transistor 92 according to the signal applied to the gate of transistor 98 by current feedback circuit 70.

Gate circuit 100 includes a pair of complimentary transistors 106, 108. Transistor 106 has its source connected to ground while transistor 108 has source connected to $V_S$. The gates of transistors 106, 108 form input 102 of gate circuit 100 and the drains of transistors 106, 108 are connected together to form output 104 of gate circuit 106.

In the preferred embodiment of the invention, current feedback circuit 70 includes a transistor 72 which has its gate connected to output 64 of reference voltage translation circuit 40, its source connected to ground, and its drain connected to the drain of a second transistor 74. Transistor 74 has its source connected to $V_S$ and its gate connected to its drain and to the gates of transistors 58, 98. Transistor 72 detects a signal at output 64 and generates a current in response to the detected signal. Transistor 74 which forms a current mirror with transistors 58 and 98 translates the current generated by transistor 72 to a gate-source voltage which is applied to transistors 58 and 98 to generate comparable currents in source followers 52 and 92, respectively.

Operation of reference translation circuit 40 and feedback circuit 70 is now described with input 42 at $V_{REF}$ and zero drain current in transistor 50, initially. Under these circumstances, the source of transistor 52 is low, turning transistor 68 on hard and pulling output 64 towards $V_S$. As output 64 goes high, transistor 72 turns on, sinking current from transistor 74. The resulting gate source voltage drop, $V_{GS}$, in transistor 74 is applied between the gate and source of transistor 58, generating drain current through source follower transistor 52. This drain current increases the enhancement of transistor 52 driving the voltage at its source toward $V_S$. The increase in the source voltage of transistor 52 tends to shut off transistor 68 and turn on transistor 66, which pulls output 64 towards ground, reducing the current in transistor 74 and consequently, also in transistors 58, 68. This continues until reference voltage translation circuit 40 has reached a balanced state in which the bias current through transistor 52 is adjusted to reflect $V_{REF}$.

Operation of voltage translation circuit 80 is also governed by feedback circuit 70, which controls the current flowing in transistor 92 through transistor 98. Accordingly, the current applied to source follower transistor 92 by transistor 98 biases transistor 92 with an operating current determined by $V_{REF}$. This biasing current sets the enhancement of transistor 92 so that a voltage at input 82 greater than $V_{REF}$ turns on transistor 106 which pulls output 104 low. Similarly, a voltage at input 82 less than $V_{REF}$ turns on transistor 108, which pulls output 104 high. In this way, gate circuit 100 is poised to change the state of output 104 as the signal applied to input 82 crosses $V_{REF}$.

Figure 4:
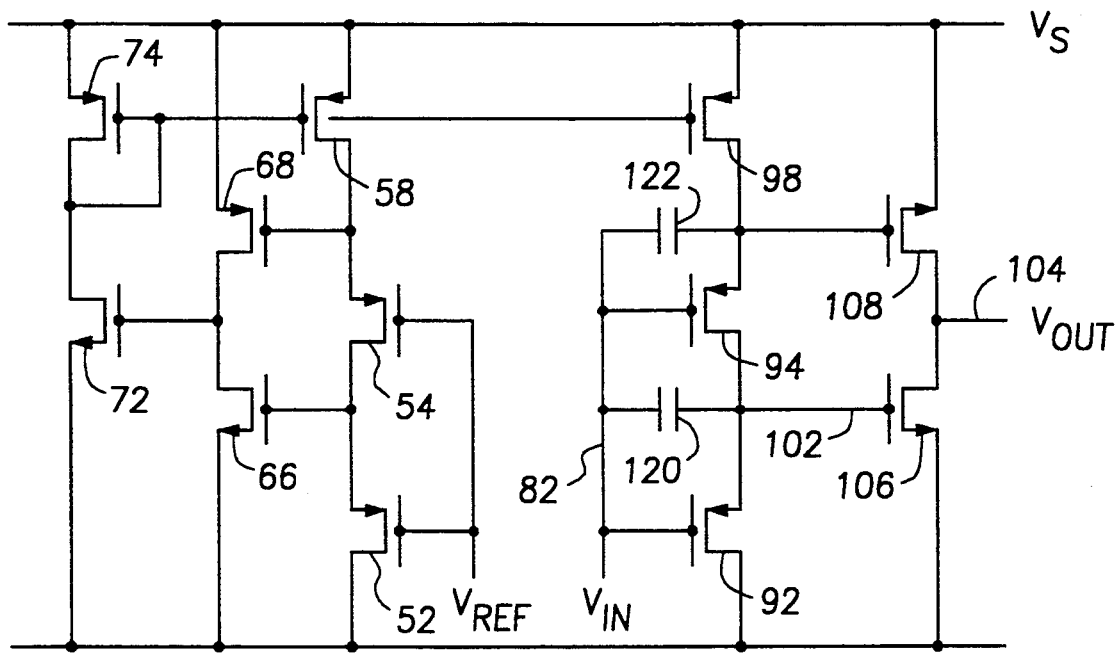
FIG. 4 is a schematic diagram of an alternative embodiment of the voltage shifting circuit in accordance with the present invention.
Figure 5:
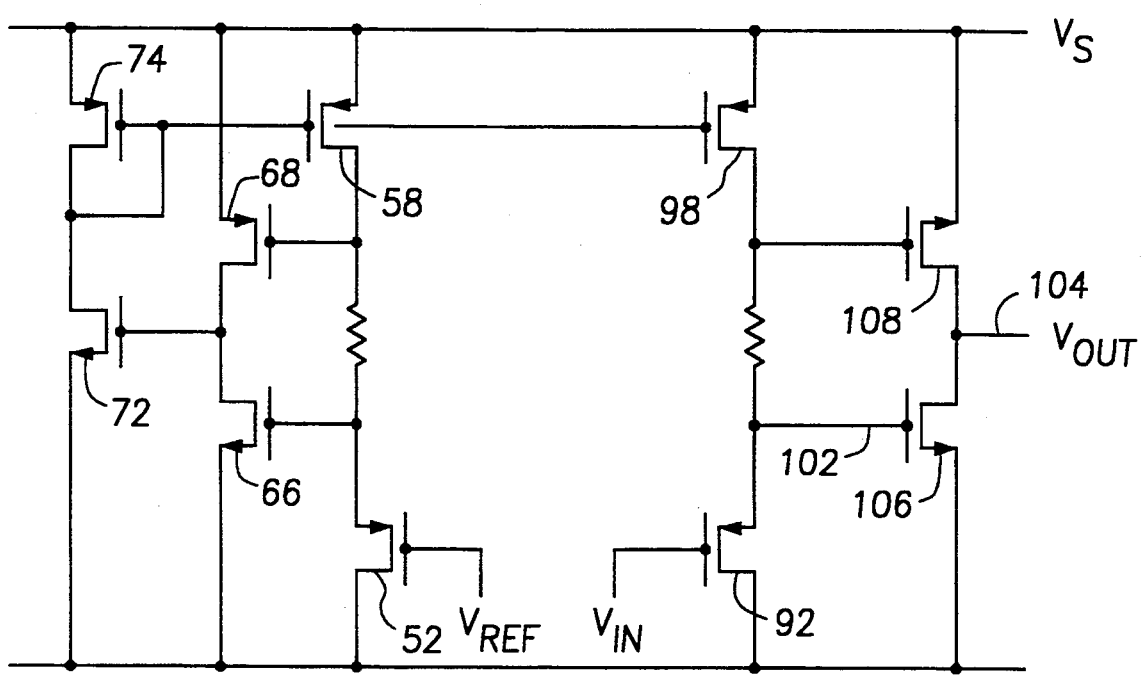
FIG. 5 is schematic diagram of yet another embodiment of the voltage shifting circuit in accordance with the present invention.

Referring now to FIG. 4, there is shown an alternative embodiment of the present invention in which second source followers 54, 94 have been added to buffers 50, 90, respectively. In addition, separate inputs are provided to transistors 66 and 68 and to transistors 106 and 108. Thus, transistor 54 has its drain connected to the source of transistor 52, its source connected to the drain of transistor 58 and to the gate of transistor 68, and its gate connected to input 42 of reference voltage translation circuit 40. Similarly, transistor 94 has its drain connected to the source of transistor 92, its source connected to the drain of transistor 98 and to the gate of transistor 108, and its gate connected to input 82 of signal voltage translation circuit 80.

Transistor 54 provides a voltage drop between the gates of transistors 66 and 68, preventing both transistors in gate circuit 60 from being turned on hard at the same time. Likewise, transistor 94 provides a voltage drop between transistors 106 and 108, preventing both transistors in gate circuit 100 from being turned on hard at the same time. This reduces the quiescent current that flows in gate circuits 60 and 100, while providing cascade connections for transistors 52 and 92, which reduces the Miller effect. Alternatively, voltage drops may be generated by connecting resistors between transistors 52 and 58 and between transistors 92 and 98. In FIG. 4 there is also shown capacitors 120, 122 connected between the gate and source of each source follower transistor 92, 94, respectively, which allow input 82 to be driven at higher frequencies.

We claim:

1. A voltage shifting circuit for generating a shifted voltage in response to an input voltage, the voltage shifting circuit comprising:

first and second voltage translation circuits, each translation circuit having an input and an output, and each translation circuit including a first transistor, a gate circuit, and a second transistor;

the first transistor having a gate, a source, and a drain, the gate forming the input of the translation circuit and the drain being connected to a reference potential, for coupling a signal from the input of the translation circuit to the source of the first transistor;

the gate circuit having an input and an output, the input being connected to the source of the first transistor and the output forming the output of the translation circuit, for producing a signal on the output that is operable between a voltage supply and a reference potential in response to a signal applied to the input of the gate circuit; and the second transistor having a gate, source, and drain, the source being connected to a voltage supply, the drain being connected to the source of the first transistor, the second transistor being effective to control a current to the first transistor in response to a signal applied to its gate;

the first translation circuit having its input connected to a reference voltage and the second translation circuit having its input and output forming an input and output, respectively, of the voltage shifting circuit; and a current feedback circuit having an input connected to the output of the first translation circuit and an output connected to the gates of the second transistors of the first and second translation circuits, for detecting the ouput of the first translation circuit and applying a corresponding signal to the gates of the second transistors of the first and second translation circuits, to control the current in the first transistors in accordance with the reference voltage.

2. The voltage shifting circuit of claim 1, wherein the reference voltage is substantially equal to a selected voltage that is indicative of a threshold level of digital logic circuitry coupled to drive the input to the voltage shifting circuit.

3. The voltage shifting circuit of claim 2 wherein the current feedback circuit comprises:

a fourth transistor of one conductivity type having its gate forming the input of the current feedback circuit, its source connected to a reference potential, and its drain connected to the drain of the fifth transistor; and a fifth transistor of complimentary conductivity type having its source connected to the voltage supply, and its gate connected to its drain and to the gates of the second transistors of the first and second voltage translation circuits.

4. The voltage shifting circuit of claim 3, wherein each of the gate circuits includes a CMOS invertor comprising a complimentary pair of p-channel and n-channel transistors, each p-channel and n-channel transistor having a gate, a source, and a drain;

the source, drain, and gate of the p-channel transistor being connected to the voltage supply, the drain of the n-channel transistor, and the source of the first transistor of the voltage translation circuit, respectively; and the source and gate of the n-channel transistor being connected to a reference potential and the source of the first transistor of the voltage translation circuit, respectively.

5. A voltage shifting circuit for generating a shifted voltage in response to an input voltage, the voltage shifting circuit comprising:

first and second voltage translation circuits, each translation circuit having an input and an output, and each translation circuit including a first transistor, a gate circuit, a voltage generating device, and a second transistor;

the first transistor having a gate, a source, and a drain, the gate forming the input of the translation circuit and the drain being connected to a reference potential, for coupling a signal from the input of the translation circuit to the source of the first transistor;

the voltage generating device having at least first and second electrodes, the first electrode being connected to the source of the first transistor, for generating a voltage drop being the first and second electrodes;

the gate circuit having a pair of inputs and an output, each of the pair of inputs being connected to one of the first and second electrodes of the voltage generating device, and the output forming the output of the translation circuit, for producing a signal on the output that is operable between a voltage supply and a reference potential in response to a signal applied to the pair of inputs of the gate circuit; and the second transistor having a gate, source, and drain, the source being connected to a voltage supply, the drain being connected to the second electrode of the voltage generating device, the second transistor being effective to control a current to the first transistor in response to a signal applied to its gate;

the first translation circuit having its input connected to a reference voltage and the second translation circuit having its input and output forming an input and output, respectively, of the voltage shifting circuit; and a current feedback circuit having an input connected to the output of the first translation circuit and an output connected to the gates of the second transistors of the first and second translation circuits, for detecting the output of the first translation circuit and applying a corresponding signal to the gates of the second transistors of the first and second translation circuits, to control the current in the first transistors in accordance with the reference voltage.

6. The voltage shifting circuit of claim 5, wherein the current feedback circuit comprises:

a fourth transistor of one conductivity type having a gate, source, and drain, the gate forming the input of the current feedback circuit and the source connected to a reference potential; and a fifth transistor of complimentary conductivity type to the fourth transistor having a gate, source, and drain, the source connected to the voltage supply, the drain connected to the drain of the fourth transistor, and the gate connected to the drain of the fifth transistor and to the gates of the second transistors of the first and second voltage translation circuits.

7. The voltage shifting circuit of claim 5, wherein each voltage generating device comprises:

a third transistor having a gate, source, and drain, the gate of the third transistor being connected to the translation circuit input and the drain and source of the third transistor forming the first and second electrodes of the voltage generating means.

8. The voltage shifting circuit of claim 7 further comprising:

a capacitor connected between the gate and source of each of the first and third transistors of the second voltage translation circuit, for modifying the input of the second voltage translation circuit to respond to higher frequency input signals.

9. The voltage shifting circuit of claim 5, wherein each voltage generating device is a resistor having first and second electrodes corresponding to the first and second electrodes of the voltage generating device.

* * * * *